United States Patent [19]

Hsieh et al.

[11] Patent Number: 4,592,992

[45] Date of Patent: Jun. 3, 1986

[54] DEVELOPER COMPOSITIONS FOR LITHOGRAPHIC PLATES

[75] Inventors: Shane Hsieh, Bridgewater; Wayne A. Mitchell, Bound Brook, both of N.J.

[73] Assignee: American Hoechst Corporation, Somerville, N.J.

[21] Appl. No.: 721,981

[22] Filed: Apr. 11, 1985

[51] Int. Cl.$^4$ .......................... G03C 5/00; G03C 7/00
[52] U.S. Cl. .................................. 430/309; 430/331; 430/325; 430/145
[58] Field of Search ............... 430/309, 331, 145, 325, 430/147

[56] References Cited

U.S. PATENT DOCUMENTS

| | | |
|---|---|---|
| 3,891,438 | 6/1975 | Katz et al. . |
| 3,891,439 | 6/1975 | Katz et al. . |
| 4,186,006 | 1/1980 | Kobayashi et al. . |
| 4,308,340 | 12/1981 | Walls . |
| 4,391,897 | 7/1983 | Gracia et al. ........................ 430/331 |
| 4,411,983 | 10/1983 | Washizawa et al. . |

FOREIGN PATENT DOCUMENTS 77401  7/1976  Japan .................................. 430/331

OTHER PUBLICATIONS

Alcolac Technical Data, Abex ®18-S—Anionic Surfactant.

Primary Examiner—Mary F. Downey
Attorney, Agent, or Firm—Richard S. Roberts

[57] ABSTRACT

The invention provides a method for developing negative working photographic elements using an aqueous developer comprising
(a) α-hydroxy toluene; and
(b) $C_{12}$ sodium alkyl ether sulfate.

7 Claims, No Drawings

DEVELOPER COMPOSITIONS FOR LITHOGRAPHIC PLATES

BACKGROUND OF THE INVENTION

The present invention relates to developer composition for photographic elements comprising photosensitive coatings on substrates, or more particularly to developer compositions for removing the non-image areas of exposed negative working lithographic printing plates.

In the past, various methods of developing printing plates have been employed. Such methods include the use of compositions containing organic solvents, surfactants, salts, acids and other art recognized materials in solution.

It is most desirable to have a developer composition which is capable of completing development in a short period of time. The oleophilic image areas of the printing plate should be ink receptive and water repellant whereas the hydrophilic non-image areas should be water receptive and greasy ink repellant.

The proper selection of organic solvents as components of the developer solution is very important. If the selected solvent is a good solvent for the light sensitive composition itself, the solvent will not satisfactorily distinguish between the exposed areas and the unexposed areas. As a result, a large portion of the image area coating is dissolved in the solvent or is severely swollen and removed. Such printing plates have no practical value. By the addition of a large amount of water to reduce the concentration of the organic solvent in the developer solution, image differentiation can be improved. However, during the development of a printing plate, particularly in negative working plates, nonimage areas comprising resin binders such as acetals, and particularly polyvinyl formal, solvate in the developer solution and separate from the support and contract to spherical shapes in a highly tacky condition. Such solvated particles deposit upon still-solvent-wet image areas and adhere permanently even after drying. Not only are these "redeposited" areas visible to the naked eye on the developed printing plate but are removed by tacky ink during printing which pulls away the true underimage, leaving skips which show as absence of image on the printed sheet.

To provide a partial solution to the problem, volatile solvents are used in many prior art developer compositions. It is expected that the use of such volatile solvents in the developer solution will prevent tackiness in the image by permitting rapid evaporation. However, use of large amounts of water soluble low boiling point solvents for example, as used in the developer described in U.S. Pat. No. 3,954,472, produces the problems of working sanitation, hazards due to low flash point, and pollution. A reduction of the concentration of these water soluble low boiling point solvents helps to minimize these problems in the working environment, however, the speed of development will be adversely affected. Also the tackiness of the coatings is reduced but not completely eliminated.

To improve the speed of development of developer solutions containing a lower concentration of low boiling points solvents, an adjuvant organic solvent is sometime added. Unfortunately, such developers suffer from several drawbacks including: toxicity, developer instability, odor or inability to effectively clean out unwanted background non-image areas.

Lithographic printing plates generally are composed of an aluminum containing substrate which may or may not have been treated with a variety processes recognized in the art process including anodization, graining and hydrophilization. The thusly prepared substrate may then be applied with a photosensitive coating comprising a photosensitizer, binding resins, colorants, acid stabilizers, surfactants and other art recognized components. Common photosensitizers include diazo compounds, including polymeric diazonium condensates salts and photopolymerizable compositions. Sensitizers, binders and printing plates employing aromatic diazonium compounds are described in U.S. Pat. Nos. 3,175,906; 3,046,118; 2,063,631; 2,667,415; 3,867,147 and 3,679,419.

Typical prior art developing compositions are described in U.S. Pat. Nos. 2,754,279; 4,381,340 and German OLS No. 2,216,419.

The present invention improves upon the aforementioned drawbacks of other lithographic developers.

It is an object of this invention to provide a developer for lithographic printing plates which will enable the operator to prepare a plate substantially free from objectionable redeposit, and further having a reduced toxicity and odor and having a higher flash point while simultaneously achieving commerically acceptable removal of non-imaged areas.

SUMMARY OF THE INVENTION

The invention provides a method for preparing a photographic element which comprises imagewise light exposing a photographic element comprising a light sensitive negative working photographic composition disposed on a substrate and then removing the unexposed, non-image areas of said exposed element with an aqueous developer consisting essentially of, in admixture:

(a) from above 4.6% to about 27% by weight of α-hydroxy toluene; and (b) from about 0.1% to about 30% of a $C_{12}$ sodium alkyl ether sulfate; wherein the weight ratio of components a to b ranges from about 0.9–1.5:1; said developer having a vapor pressure of not more than about 0.15mm Hg at 25° C. and a flash point of at least about 220° F. and said developer being capable of substantially completely removing said non-image areas in about 2 minutes or less while simultaneously removing substantially none of the exposed image areas; and substantially none of the material comprising said removed non-image areas is re-deposited back onto said photographic element.

DETAILED DESCRIPTION OF THE PREFERRED EMBODIMENT

As the first step in the production of negative working photographic elements such as lithographic printing plates, a sheet substrate such as aluminum compositions suitable for the manufacture of lithographic printing plates such as, Alcoa 3303 and Alcoa 1100, which may or may not have been pretreated by standard graining and/or etching and/or anodizing techniques as are well known in the art, and also may or may not have been treated with a composition, such as polyvinyl phosphonic acid, suitable for use as a hydrophilizing layer for lithographic plates is coated with a light sensitive polymeric diazonium salt or photopolymer containing composition. Such compositions may also contain binding resins, such as polyvinyl formal resins, colorants, acid stabilizers, surfactants, exposure indicators or other (art recognized ingredients).

The photosensitive sheet material is then exposed to a suitable radiation source through a mask or transparency, and the exposed sheet then developed for removal of the unexposed photosensitive materials.

The mixture is usually prepared in a solvent composition which is compatible with all the other composition ingredients. The light sensitive composition is then coated on the substrate and the solvent dried off.

Diazonium compounds most commonly employed in the preparation of light sensitive compositions suitable for the present application may be characterized by the generic structure $A-N_2^+X^-$, wherein A is an aromatic or heterocylic residue and X is the anion of an acid.

Specific examples of light sensitive diazonium materials useful as aforementioned include higher molecular weight compositions obtained, for example, by the condensation of certain aromatic diazonium salts in an acid condensation of certain aromatic carbonyl compounds such as formaldehyde, as disclosed for example in U.S. Pat. Nos. 2,063,631 and 2,667,415. A preferred class of diazonium compounds is described in U.S. Pat. No. 3,849,392.

A most preferred diazonium salt is the polycondensation product of 3-methoxy-4-diazo-diphenyl amine sulfate and 4,4'-bis-methoxy methyl-diphenyl ether, precipitated as the mesitylene sulfonate, as taught in U.S. Pat. No. 3,849,392.

Suitable photopolymerizable compositions are well known to the skilled artisan.

The present invention provides a method for developing such exposed photosensitive elements by contacting them, to remove the unexposed non-image areas, using a developer which contains the aforementioned ingredients in an aqueous mixture. The resultant developer has a flash point which is preferably at least 200° F. and more preferably at least 220° F. It further has a vapor pressure of not more than about 0.15mm Hg at 25° C.

The α-hydroxy toluene component is present in an amount of from about 4.6% to about 27% by weight of the developer composition. A more preferred range is from about 4.6% to about 10% and most preferably from about 3% to about 7%.

In a preferred embodiment the composition also contains at least one salt selected from the group consisting of potassium and sodium phosphates, nitrates, chlorides, borates, acetates, sulfates, citrates, sulfites, tartarates, oxalates, formates, propionates, succinates, glutamates and benzoates. The salt component is present in the developer in the amount of from about 0.1% to about 10% by weight of the developer. Preferably it is present in an amount of from about 0.5% to about 10% and more preferably from about 1% to about 5%.

In another preferred embodiment, the composition further contains at least component selected from the group consisting of polymethoxy ethylene glycol, polyethylene glycol, propylene glycol and glycerine. This component is present in the developer in an amount of from about 0.1 to about 10% by weight of the developer, preferably from about 0.5% to about 7% and more preferably from about 1% to about 5%.

The composition also contains a $C_{12}$ sodium alkyl ether sulfate. This component is present in an amount of from about 0.1% to about 30% by weight of the developer. A more preferred range is from about 1% to about 20% and still more preferably from about 2% to about 10%. The most preferred compound of this class is Abex 18-S available commerically from Alcolac of Baltimore, Md. The weight ratio of α-hydroxy toluene to $C_{12}$ sodium alkyl ether sulfate preferably ranges from about 0.9–1.5:1.

In the preferred embodiment, the developer of the present invention preferably contains optional minor amounts of ingredients which aid in processing of the printing plate and the prevention of scumming in the non-image areas of the element and can further render the background areas more hydrophilic when the element is a lithographic printing plate. Such ingredients include anti-foam agents, anti-oxidants and film formers such as polyethylene glycol, polyvinyl pyrrolidone and starch which lessen the tendency of removed plate coating to be re-deposited back onto the plate surface and which allows the developer to finish and preserve the plate as well. One preferred anti-foam agent is Dow DB-31. A preferred anti-oxidant is Irganox 1010 commercially available from Ciba-Geigy. The developer is capable of substantially completely removing the unexposed non-image areas of a photographic element in about 2 minutes or less while simultaneously removing substantially none of the exposed image areas. Substantially none of the material comprising said removed non-image areas is re-deposited back onto said photographic element.

The following non-limiting examples serve to illustrate the invention.

EXAMPLE 1

An ENCO ®N-25 negative working printing plate available commercially from American Hoechst Corporation is imagewise exposed to actinic radiation in a manner well known to the skilled artisan. The thusly exposed plate is then washed with the following developer composition:

| | Weight % |
| --- | --- |
| Water | 81.35 |
| polyethylene glycol | 2.50 |
| potassium phosphate | 0.5 |
| potassium hydrogen phosphate | 0.5 |
| Abex 18-S (35% solids) | 10.10 |
| α-hydroxy toluene | 5.00 |
| Dow DB-31 (anti-foam) | 0.05 |

The plate develops cleanly in a customary developing machine without noticeable background scumming or re-deposit of removed plate coatings.

EXAMPLE 2

Example 1 is repeated except the developer used is as follows:

| | Weight % |
| --- | --- |
| Water | 1 |
| α-hydroxy toluene | 27 |
| Abex 18-S (35% solids) | 72 |

Similar results are noted.

EXAMPLE 3

Example 1 is repeated except the developer used is as follows:

|  | Weight % |
| --- | --- |
| Water | 56.44 |
| propylene glycol | 2.50 |
| di-potassium phosphate | 0.50 |
| mono-potassium phosphate | 0.50 |
| Abex 18-S (35% solids) | 30.00 |
| α-hydroxy toluene | 10.00 |
| anti-foam DB-31 | 0.05 |
| Irganox 1010 | 0.01 |

Similar results are noted.

EXAMPLE 4

Example 1 is repeated except the developer used is as follows:

|  | Weight % |
| --- | --- |
| Water | 82.73 |
| polyethylene glycol | 2.50 |
| di-sodium phosphate | 0.62 |
| mono-sodium phosphate | 0.32 |
| Abex 18-S (35% solids) | 9.20 |
| α-hydroxy toluene | 4.60 |
| anti-foam DB-31 | 0.03 |

Similar results are noted.

EXAMPLE 5

Example 1 is repeated except the developer used is as follows:

|  | Weight % |
| --- | --- |
| Water | 81.64 |
| polyvinyl pyrrolidone | 1.00 |
| propylene glycol | 2.50 |
| di-potassium phosphate | 0.50 |
| mono-potassium phosphate | 0.50 |
| Abex 18-S (35% solids) | 9.20 |
| α-hydroxy toluene | 4.60 |
| anti-foam DB-31 | 0.05 |
| Irganox 1010 | 0.01 |

What is claimed:

1. A method for preparing a photographic element which comprises imagewise light exposing a photographic element comprising a light sensitive negative working photographic composition which composition comprises a photosensitizer selected from the group consisting of a light sensitive diazo compound and a photopolymerizable composition which is disposed on a substrate and then removing the unexposed, non-image areas of said exposed element with an aqueous developer consisting essentially of, in admixture:
   (a) from above 4.6% to about 27% by weight of α-hydroxy toluene; and
   (b) from about 0.1% to about 30% of a $C_{12}$ sodium alkyl ether sulfate; wherein the weight ratio of components a to b ranges from about 0.9–1.5:1; said developer having a vapor pressure of not more than about 0.15 mm Hg at 25° C. and a flash point of at least about 220° F. and said developer being capable of substantially completely removing said non-image areas in about 2 minutes or less while simultaneously removing substantially none of the exposed image areas; and substantially none of the material comprising said removed non-image areas is re-deposited back onto said photographic element.

2. The method of claim 1 wherein said developer further comprises from about 0.1% to about 10% by weight of at least one salt selected from the group consisting of sodium and potassium phosphates, nitrates, chlorides, borates, acetates, sulfates, citrates, sulfites, tartarates, oxalates, formates, propionates, succinates, glutamates and benzoates.

3. The method of claim 2 wherein said developer further comprises about 0.1% to about 10% by weight of one or more compounds selected from the group consisting of polymethoxy ethylene glycol, polyethylene glycol, propylene glycol and glycerine.

4. The method of claim 1 wherein said component (a) is present in an amount of from about 4.6% to about 10% by weight of said developer.

5. The method of claim 1 wherein said component (b) is present in an amount of from about 2% to about 15% by weight of said developer.

6. The method of claim 1 wherein said component (a) is present in an amount of from about 4.6% to about 7% by weight of said developer; and said component (b) is present in an amount of from about 2% to about 10%.

7. The method of claim 1 further comprising one or more compounds selected from the group consisting of film formers, anti-oxidants and anti-foam agents.

* * * * *